(12) United States Patent
Chang Chien et al.

(10) Patent No.: US 11,973,037 B2
(45) Date of Patent: Apr. 30, 2024

(54) PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Nan-Chun Lin, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 217 days.

(21) Appl. No.: 17/330,416

(22) Filed: May 26, 2021

(65) Prior Publication Data

US 2022/0165673 A1 May 26, 2022

(30) Foreign Application Priority Data

Nov. 20, 2020 (TW) .................................. 109140644

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 21/4853; H01L 21/4857; H01L 21/565; H01L 21/568; H01L 21/6835;
(Continued)

(56) References Cited

U.S. PATENT DOCUMENTS

| 2005/0046002 A1* | 3/2005 | Lee ......................... H01L 24/24 |
| | | 257/E21.705 |
| 2012/0049364 A1* | 3/2012 | Sutardja .............. H01L 23/3114 |
| | | 257/738 |

(Continued)

FOREIGN PATENT DOCUMENTS

WO     2018122995     7/2018

*Primary Examiner* — Kyoung Lee
*Assistant Examiner* — Christina A Sylvia
(74) *Attorney, Agent, or Firm* — JCIPRNET

(57) ABSTRACT

A package structure including a first die, a second die, a dielectric body, a conductive terminal, a circuit layer and a patterned insulating layer is provided. The second die is disposed on the first die. A second active surface of the second die faces a first active surface of the first die. The dielectric body covers the first die. The conductive terminal is disposed on the dielectric body and opposite to the second die. The circuit layer includes a first circuit portion and a second circuit portion. The first circuit portion penetrates the dielectric body. The first die is electrically connected to the conductive terminal through the first circuit portion. The second circuit portion is embedded in the dielectric body. The second die is electrically connected to the first die through the second circuit portion. The patterned insulating layer covers the circuit layer and is embedded in the dielectric body.

16 Claims, 7 Drawing Sheets

(51) Int. Cl.
  *H01L 21/56*  (2006.01)
  *H01L 21/683*  (2006.01)
  *H01L 23/00*  (2006.01)
  *H01L 23/31*  (2006.01)
  *H01L 23/367*  (2006.01)
  *H01L 25/00*  (2006.01)
  *H01L 25/065*  (2023.01)

(52) U.S. Cl.
  CPC .......... *H01L 21/565* (2013.01); *H01L 21/568* (2013.01); *H01L 21/6835* (2013.01); *H01L 23/3128* (2013.01); *H01L 23/367* (2013.01); *H01L 23/5383* (2013.01); *H01L 23/5386* (2013.01); *H01L 24/19* (2013.01); *H01L 24/20* (2013.01); *H01L 25/0657* (2013.01); *H01L 25/50* (2013.01); *H01L 2221/68372* (2013.01); *H01L 2224/214* (2013.01); *H01L 2225/06513* (2013.01); *H01L 2225/06558* (2013.01); *H01L 2225/06586* (2013.01); *H01L 2225/06589* (2013.01)

(58) Field of Classification Search
  CPC ............. H01L 21/486; H01L 23/49816; H01L 23/49822; H01L 23/49827; H01L 23/13; H01L 23/4824; H01L 23/3128; H01L 23/367; H01L 23/5383; H01L 23/5386; H01L 23/5389; H01L 23/4334; H01L 23/5384; H01L 24/19; H01L 24/20; H01L 24/13; H01L 24/24; H01L 24/82; H01L 24/03; H01L 25/0657; H01L 25/50; H01L 25/18; H01L 2221/68372; H01L 2221/68345; H01L 2221/68359; H01L 2225/06513; H01L 2225/06558; H01L 2225/06586; H01L 2225/06589; H01L 2225/1041; H01L 2225/06517; H01L 2225/06524; H01L 2225/06548; H01L 2225/1035; H01L 2225/1058; H01L 2225/1094; H01L 2224/214; H01L 2224/0401; H01L 2224/04105; H01L 2224/16145; H01L 2224/16225; H01L 2224/16227; H01L 2224/18; H01L 2224/24226; H01L 2224/32225; H01L 2224/32245; H01L 2224/73253; H01L 2224/73267; H01L 2224/81005; H01L 2224/82005; H01L 2224/8203; H01L 2224/92125; H01L 2224/92244; H01L 2224/0231; H01L 2224/02331; H01L 2224/02381; H01L 2224/73204; H01L 2224/97; H01L 2924/1433; H01L 2924/1436; H01L 2924/15311
  See application file for complete search history.

(56) References Cited

U.S. PATENT DOCUMENTS

2018/0076179 A1\*  3/2018  Hsu ...................... H01L 25/0657
2018/0122764 A1\*  5/2018  Chen ....................... H01L 24/01
2018/0151477 A1    5/2018  Yu et al.

\* cited by examiner

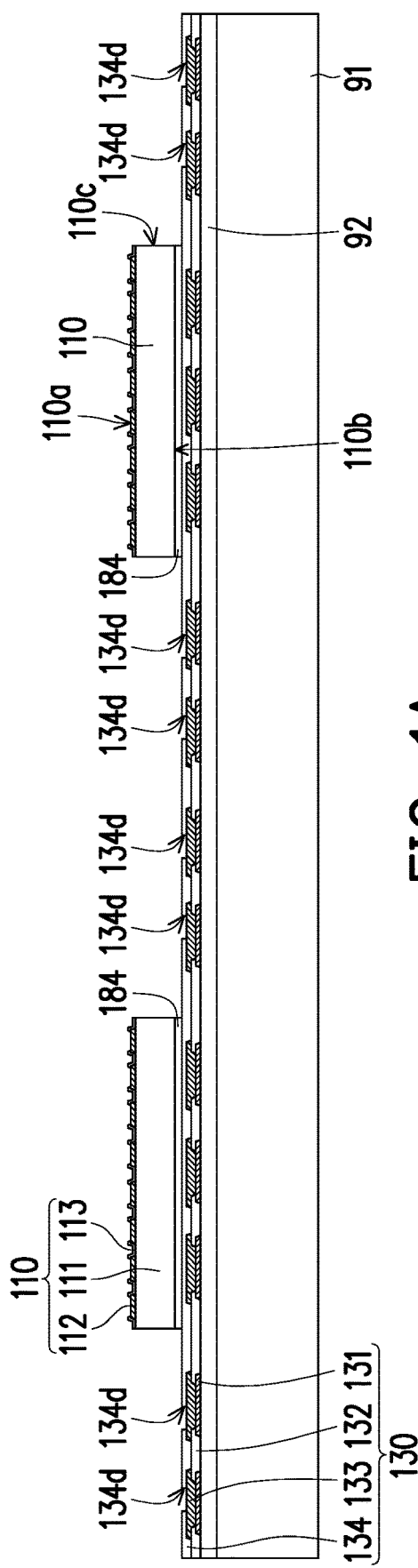
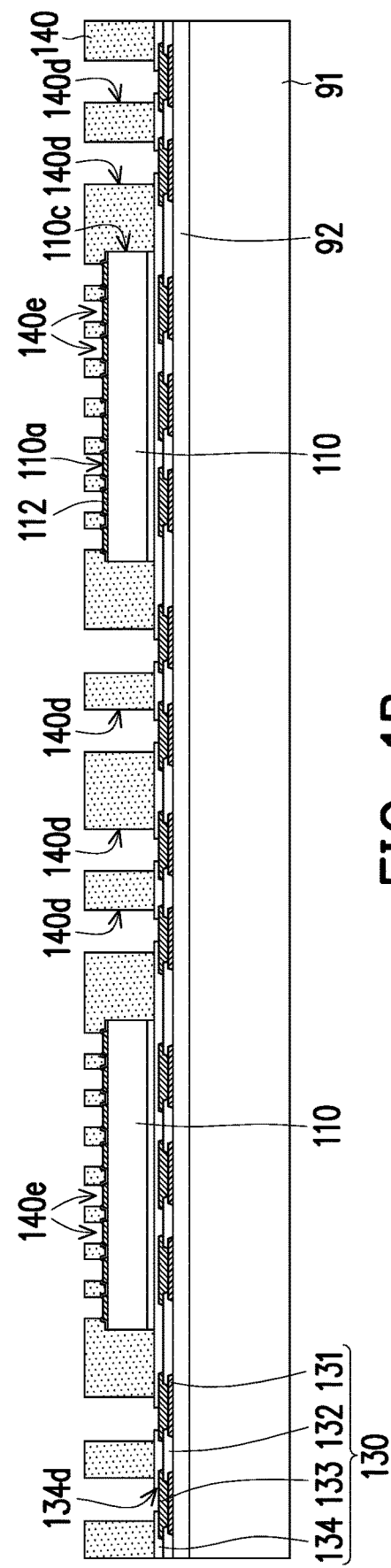
FIG. 1A
FIG. 1B

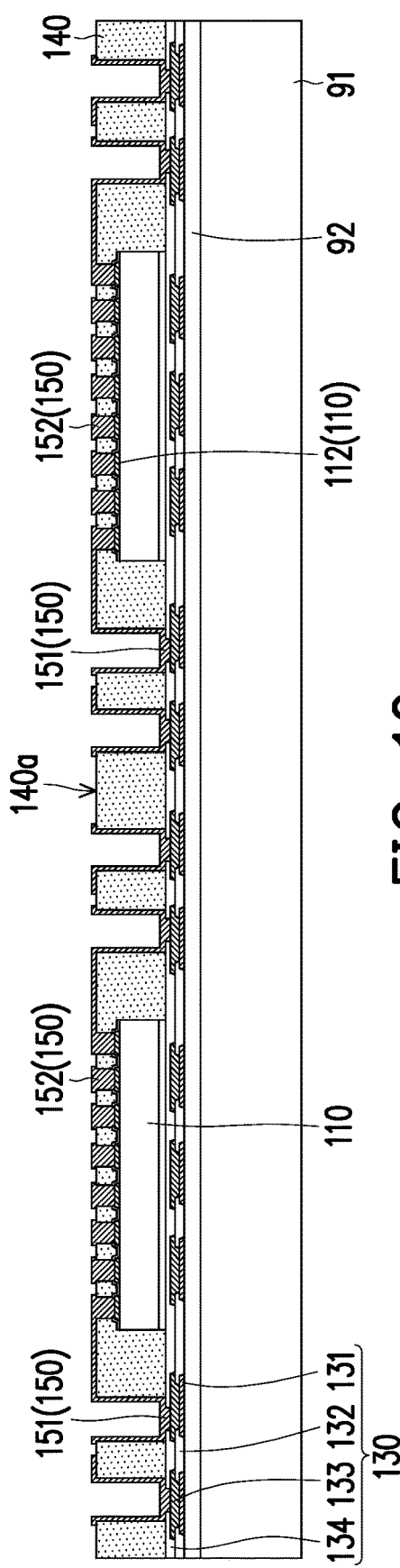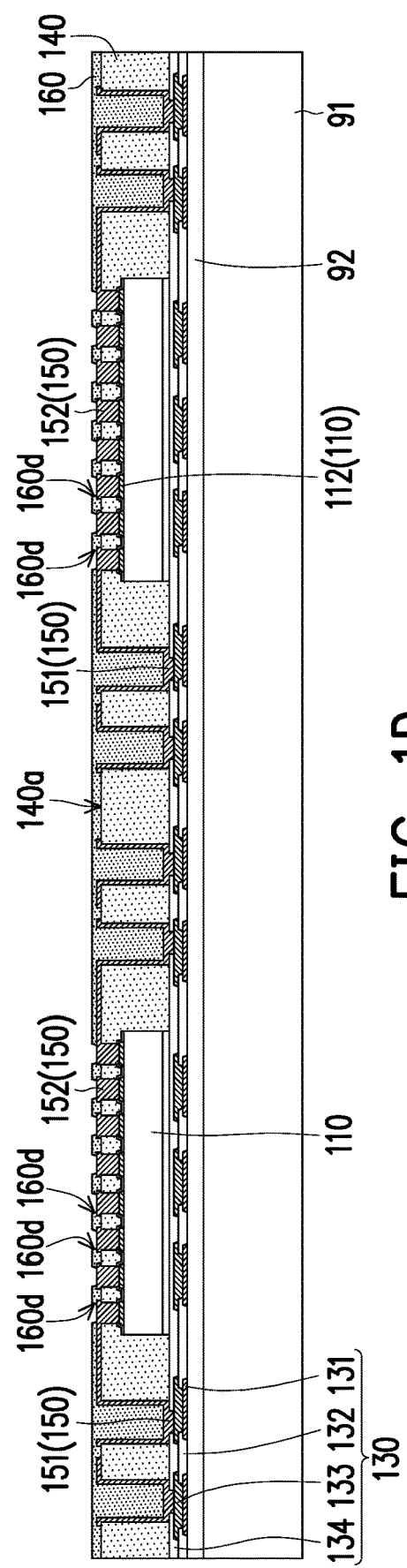

PACKAGE STRUCTURE AND MANUFACTURING METHOD THEREOF

CROSS-REFERENCE TO RELATED APPLICATION

This application claims the priority benefit of Taiwan application no. 109140644, filed on Nov. 20, 2020. The entirety of the above-mentioned patent application is hereby incorporated by reference herein and made a portion of this specification.

TECHNICAL FIELD

The disclosure relates to a package structure and a manufacturing method thereof, and more particularly, to a package structure having a plurality of dies and a manufacturing method thereof.

BACKGROUND

In order to enable electronic products to achieve the design of light, thin and short, semiconductor packaging technology is also advancing day by day to develop products that meet the requirements of small size, light weight, high density, and high competitiveness in the market.

In a die package structure with multiple dies, how to improve the quality or efficiency of signal transmission between the dies has become an urgent problem to be solved at present.

SUMMARY

The disclosure provides a package structure and a manufacturing method of the package structure which may provide better signal transmission quality or efficiency.

A package structure of the disclosure includes a first die, a second die, a dielectric body, a conductive terminal, a first circuit layer and a first patterned insulating layer. The first die has a first active surface. The second die has a second active surface. The second die is disposed on the first die with the second active surface facing the first active surface. The dielectric body covers the first die. The conductive terminal is disposed on the dielectric body and opposite to the second die. The first circuit layer includes a first circuit portion and a second circuit portion. The first circuit portion penetrates the dielectric body. The first die is electrically connected to the conductive terminal through the first circuit portion. The second circuit portion is embedded in the dielectric body. The second die is electrically connected to the first die through the second circuit portion. The first patterned insulating layer covers the first circuit layer and is embedded in the dielectric body.

The manufacturing method of the package structure of the disclosure includes the following step: providing a carrier; disposing a first die on the carrier; forming a dielectric body on the carrier to cover the first die; forming a first circuit layer on the carrier, the first circuit layer including a first circuit portion and a second circuit portion, wherein the first circuit portion penetrates the dielectric body, and the second circuit portion is embedded in the dielectric body; forming a first patterned insulating layer on the carrier to cover the first circuit layer and be embedded in the dielectric body; disposing a second die on the first die, a second active surface of the second die facing a first active surface of the first die, the second die being electrically connected to the first die through the second circuit portion; and removing the carrier to form a conductive terminal on the dielectric body opposite to the second die, the first die being electrically connected to the conductive terminal through the first circuit portion.

Based on the above, the package structure and the manufacturing method of the package structure of the disclosure may provide better signal transmission quality or efficiency.

To make the aforementioned more comprehensible, several embodiments accompanied with drawings are described in detail as follows.

BRIEF DESCRIPTION OF THE DRAWINGS

FIG. 1A to FIG. 1E are partial cross-sectional views of a portion of a manufacturing method of a package structure according to the first embodiment of the disclosure.

DETAILED DESCRIPTION

Figure 1E:
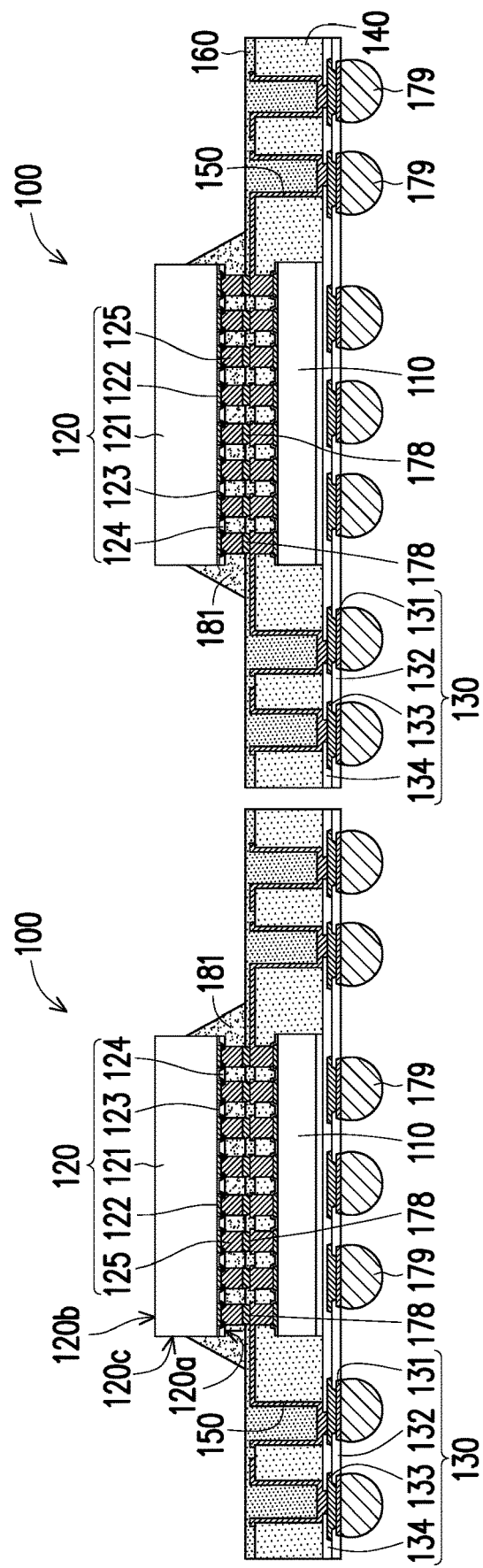

Directional terminology (e.g., top, down, right, left, front, rear, top, and bottom) is used with reference to the orientation of the Figure(s) being described. As such, the directional terminology is used for purposes of illustration and is in no way limiting. In addition, for clarity, some of the film layers or members may be omitted in the drawings.

Unless otherwise restricted, the terms "disposed", "connected", "contact" and other similar terms herein are used in a broad sense and cover direct and indirect configuration, connection, contact and other similar terms. Similarly, the term "facing (faces)" and the similar terms herein are used in a broad sense and cover direct and indirect facing. Therefore, the drawings and description should be regarded as illustrative in nature and not restrictive.

Unless otherwise clearly indicated, the method in this disclosure should not be construed as requiring steps therein to be performed in a particular order.

The disclosure will be described more comprehensively below with reference to the drawings for the embodiments. However, the disclosure may also be implemented in different forms rather than being limited by the embodiments described in the disclosure. Thicknesses, dimensions and sizes of layers and regions in the drawings are exaggerated for clarity. The same reference numbers are used in the drawings and the description to indicate the same or like parts, which are not repeated in the following embodiments.

FIG. 1A to FIG. 1E are partial cross-sectional views of a portion of a manufacturing method of a package structure according to the first embodiment of the disclosure.

Referring to FIG. 1, a carrier 91 is provided. The disclosure has no particular limitation on the carrier 91, as long as the carrier 91 may be adapted to carry film layers formed thereon or devices disposed thereon.

In this embodiment, a release layer 92 may be provided on the carrier 91, but the disclosure is not limited thereto. The release layer 92 is, for example, a light to heat conversion (LTHC) adhesive layer or other similar film layers.

Continuing to refer to FIG. 1A, in this embodiment, a redistribution circuit layer 130 may be formed on the carrier 91. The redistribution circuit layer 130 may include conductive layers 131 and 133 and insulating layers 132 and 134. The insulating layer 134 at the topmost (e.g., the insulating layer farthest from the carrier 91 in the redistribution circuit layer 130, which may be referred to as: a second patterned insulating layer) may have a plurality of openings 134d, and the openings 134d may expose the conductive layer 133 at the topmost (i.e., the conductive layer farthest from the carrier 91 in the redistribution circuit layer 130, which may be referred to as: a second circuit layer). The redistribution circuit layer 130 may be formed by a commonly used semiconductor process (e.g., a deposition process, a lithography process and/or an etching process), which will not be repeated hereinafter.

Continuing to refer to FIG. 1A, a first die 110 is disposed on the carrier 91. In this embodiment, the first die 110 may be disposed on the redistribution circuit layer 130, but the disclosure is not limited thereto.

In this embodiment, the first die 110 may include a substrate 111, a plurality of die pads 112 (which may be referred to as: first die pads) and a die insulating layer 113 (which may be referred to as: a first die insulating layer). A device region (not illustrated) is provided on one side of the substrate 111, and a surface on which the device region is located may be referred to as a first active surface 110a. A surface opposite to the first active surface 110a may be referred to as a first back surface 110b. A surface connected between the first active surface 110a and the first back surface 110b may be referred to as a first lateral surface 110c. The die pads 112 may be disposed on the first active surface 110a. The die insulating layer 113 may cover the die pad 112, and the die insulating layer 113 exposes a portion of the die pad 112. In the general die design, devices in the device region (devices in the device region of the first die 110) may be electrically connected to the corresponding die pads 112 (e.g., a portion of the die pads 112 of the first die 110) through a corresponding back end of line interconnect (BEOL interconnect).

In this embodiment, the die pad 112 is, for example, an aluminum pad, a copper pad or other suitable die pads, but the disclosure is not limited thereto.

In an embodiment, an adhesive layer 184 may be provided on the first back surface 110b of the first die 110, but the disclosure is not limited thereto. The adhesive layer 184 may include a die attach film (DAF), but the disclosure is not limited thereto.

Referring to FIG. 1A and FIG. 1B, a dielectric body 140 is formed on the carrier 91. The dielectric body 140 may cover the first die 110. For instance, the dielectric body 140 may cover the first active surface 110a and the first lateral surface 110c of the first die 110. The dielectric body 140 may include a second dielectric opening 140e exposing the die pad 112. In an embodiment, the dielectric body 140 may be formed by a coating method or other suitable processes, but the disclosure is not limited thereto.

In this embodiment, the dielectric body 140 may be formed on the redistribution circuit layer 130, but the disclosure is not limited thereto. The dielectric body 140 may include a first dielectric opening 140d exposing the conductive layer 134 at the topmost. For example, a photoimageable dielectric material (PID material) may be coated on the redistribution circuit layer 130. Then, a portion of the photoimageable dielectric material may be cured by photopolymerization and/or baking. Moreover, after curing the part of the photoimageable dielectric material, wet clean or other suitable methods may be used to remove the remaining photoimageable dielectric material that is not cured. Accordingly, the dielectric body 140 having the first dielectric opening 140d and the second dielectric opening 140e may be formed by the above-mentioned method.

In an embodiment, a forming method of the dielectric body 140 may be adjusted according to its property, which is not limited in the disclosure.

Referring to FIG. 1B and FIG. 1C, a first circuit layer 150 is formed on the carrier 91. The first circuit layer 150 may cover the dielectric body 140, and the first circuit layer 150 may be filled into the first dielectric opening 140d (marked in FIG. 1B) and the second dielectric opening 140e (marked in FIG. 1B) of the dielectric body 140.

In this embodiment, the first circuit layer 150 may be formed by a sputtering process, a lithography process, an electroplating process and/or an etching process, but the disclosure is not limited thereto. For instance, a seed layer may be formed on a surface of the dielectric body 140 by the sputtering process. Then, a patterned photoresist layer may be formed on the seed layer by the lithography process. Then, a plating layer may be formed on a portion of the seed layer exposed by the patterned photoresist layer through the electroplating process. Then, the patterned photoresist layer and another part of the seed layer not covered by the plating layer may be removed by the etching process. Patterned seed layers 151s, 152s and 153s (marked in FIG. 1G) and patterned plating layers 151p, 152p and 153p (marked in FIG. 1G) disposed thereon may constitute the patterned first circuit layer 150.

In this embodiment, the first circuit layer 150 may include a first circuit portion 151. The first circuit portion 151 may be disposed in the first dielectric opening 140d (marked in FIG. 1B) of the dielectric body 140. A portion of the first circuit portion 151 disposed in the first dielectric opening 140d may be conformally covered on a bottom portion and a sidewall of the first dielectric opening 140d.

In this embodiment, the first circuit portion 151 may be completely filled into the openings 134d (marked in FIG. 1B) of the insulating layer 134. The first circuit portion 151 may directly contact the conductive layer 133 at the topmost in the redistribution circuit layer 130. For instance, the pattered seed layer 151s (marked in FIG. 1G) belonging to the first circuit portion 151 may directly contact a portion of the conductive layer 133.

In this embodiment, the first circuit portion 151 and the conductive layer 133 are formed by different steps. In this way, an interface F1 (marked in FIG. 1G) may be provided between the first circuit portion 151 and the conductive layer 133 in contact with each other. For instance, the interface F1 may be provided between a portion of the patterned seed layer 151s belonging to the first circuit portion 151 (marked in FIG. 1G) and the conductive layer 133.

In this embodiment, the first circuit layer 150 may include a second circuit portion 152. The second circuit portion 152 may be disposed in the second dielectric opening 140e (marked in FIG. 1B) of the dielectric body 140, and the second circuit portion 152 may be completely filled into the second dielectric opening 140e. The second circuit portion 152 may directly contact the die pad 112 of the first die 110. For instance, the pattered seed layer 152s (marked in FIG. 1G) belonging the second circuit portion 152 may directly contact the die pad 112 of the first die 110.

Referring to FIG. 1C and FIG. 1D, a first patterned insulating layer 160 is formed on the carrier 91. The material of the first patterned insulating layer 160 may include an inorganic material, an organic material, other suitable insulating materials or a stack of the above, which is not limited by the disclosure. In an embodiment, a forming method of the first patterned insulating layer 160 may be adjusted according to its property, which is not limited in the disclosure.

In this embodiment, the first patterned insulating layer 160 may cover the first circuit layer 150. The first patterned insulating layer 160 may include a plurality of insulating openings 160d to expose a portion of the first circuit layer 150. For instance, the insulating openings 160d may expose a portion of the second circuit portion 152.

In this embodiment, the first patterned insulating layer 160 may contact the dielectric body 140. For instance, the first patterned insulating layer 160 may directly contact a portion of a dielectric top surface 140a (i.e., a surface of the first patterned insulating layer 160 farthest form the carrier 91 or the redistribution circuit layer 130) of the dielectric body 140.

In this embodiment, the first patterned insulating layer 160 and the dielectric body 140 are formed by different steps. In this way, an interface F2 (marked in FIG. 1G) may be provided between the first patterned insulating layer 160 and the dielectric body 140 in contact with each other.

In this embodiment, a portion of the first patterned insulating layer 160 may be filled into the first dielectric opening 140d (marked in FIG. 1B) of the dielectric body 140. Accordingly, the possibility of peeling of the first circuit portion 151 disposed in the first dielectric opening 140d may be reduced. In addition, when the first circuit layer 150 is formed, the thickness of the plating may be reduced to improve the manufacturing efficiency of the package structure.

Referring to FIG. 1D and FIG. 1E, after the first patterned insulating layer 160 is formed, the second die 120 may be disposed on the first die 110. The second die 120 may be electrically connected to the first die 110 through a conductive connecting piece 178.

In this embodiment, the second die 120 may include a substrate 121, a plurality of die pads 122 (which may be referred to as: second die pads), a die insulating layer 123 (which may be referred to as: a second die insulating layer), a die protective layer 124 and a plurality of die terminals 125. A device region (not illustrated) is provided on one side of the substrate 121, and a surface on which the device region is located may be referred to as a second active surface 120a. A surface opposite to the second active surface 120a may be referred to as a second back surface 120b. A surface connected between the second active surface 120a and the second back surface 120b may be referred to as a second lateral surface 120c. The die pads 122 may be disposed on the second active surface 120a. The die insulating layer 123 may cover the die pads 122, the die protective layer 124 may cover the die insulating layer 123, and the die insulating layer 123 and the die protective layer 124 may expose a portion of the die pads 122. In the general chip design, devices in the device region (devices in the device region of the second die 120) may be electrically connected to the corresponding pads 122 (e.g., a portion of the die pads 122 of the second die 120) through a corresponding back end of line interconnect (BEOL interconnect). The die terminal 125 may include a seed layer 125s (marked in FIG. 1G), a plating layer 125p (marked in FIG. 1G) and a conductive connecting layer 125r (marked in FIG. 1G), but the disclosure is not limited thereto. In an embodiment, the seed layer 125s of the die terminal 125 may directly contact the die pad 122, and the plating layer 125p may be disposed between the seed layer 125s and conductive connecting layer 125r. However, the disclosure is not limited in this regard. The die pad 122 may be electrically connected to the corresponding conductive connecting piece 178 through the corresponding die terminal 125.

In an embodiment, the conductive connecting piece 178 may be a solder ball, a conductive bump, or a conductive connecting piece may have other forms or shapes. The conductive connecting piece 178 may be formed through a ball placement, a reflow and/or other suitable processes.

In this embodiment, a filling layer 181 may be formed between the second die 125 and the first patterned insulating layer 160. The filling layer 181 may include a capillary underfill (CUF) or other suitable underfills, but the disclosure is not limited thereto.

Continuing to refer to FIG. 1D and FIG. 1E, in this embodiment, after the carrier 91 is removed, a plurality of conductive terminals 179 may be formed. The conductive terminal 179 may be a conductive pillar, a solder ball, a conductive bump, or the conductive terminal 179 may have other forms or shapes. The conductive terminals 179 may be formed through electroplating, deposition, ball placement, reflow, and/or other suitable processes. The conductive terminal 179 may be electrically connected to the corresponding first circuit portion 151 of the first circuit layer 150 through corresponding circuits in the redistribution circuit layer 130.

Referring to FIG. 1E, in this embodiment, a singulation process may be used to cut through at least the redistribution circuit layer 130, the dielectric body 140 and the first patterned insulating layer 160. The singulation process may include, for example, a dicing process/cutting process, but the disclosure is not limited thereto.

It should be noted that, after the singulation process is performed, similar device symbols will still be used for the singulated devices. For instance, the first die 110 (as shown in FIG. 1D) may become the first die 110 (as shown in FIG. 1E) after singulation; the redistribution circuit structure 130 (as shown in FIG. 1D) may become the redistribution circuit structure 130 (as shown in FIG. 1E) after singulation; the dielectric body 140 (as shown in FIG. 1D) may become the dielectric body 140 (as shown in FIG. 1E) after singulation; the first patterned insulating layer 160 (as shown in FIG. 1D) may become the first patterned insulating layer 160 (as shown in FIG. 1E) after singulation; and so and so forth. Other singulated devices will follow the same symbol rules as described above, and will not be repeated or specifically shown herein.

It is worth noting that the disclosure does not limit the order of disposing the second die 120, disposing the conductive terminals 179 and performing the singulation process (if any). For instance, the conductive terminals 179 may be formed after the second die 120 is disposed, and the singulation process is then performed. As another example, the singulation process may be performed after the second die 120 is disposed, and the conductive terminals 179 are then formed.

Figure 1F:
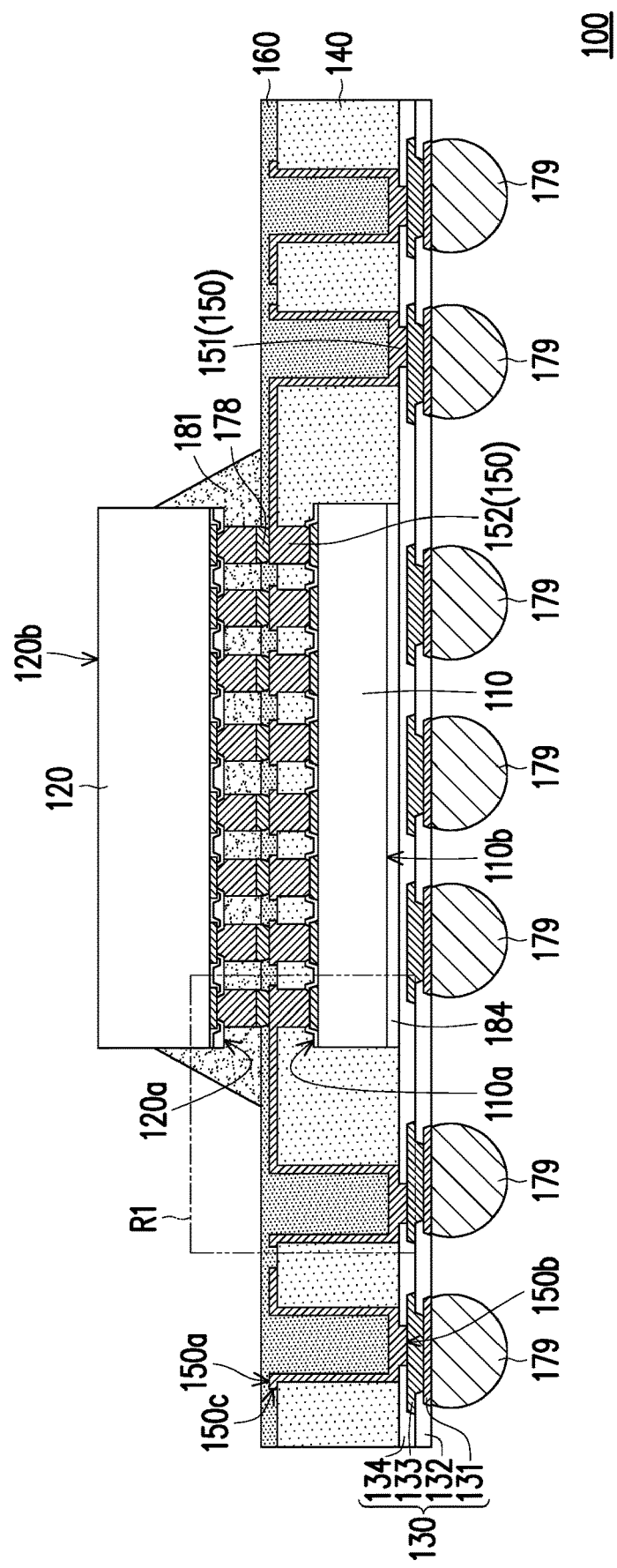
FIG. 1F is a cross-sectional view of the package structure according to the first embodiment of the disclosure.
Figure 1G:
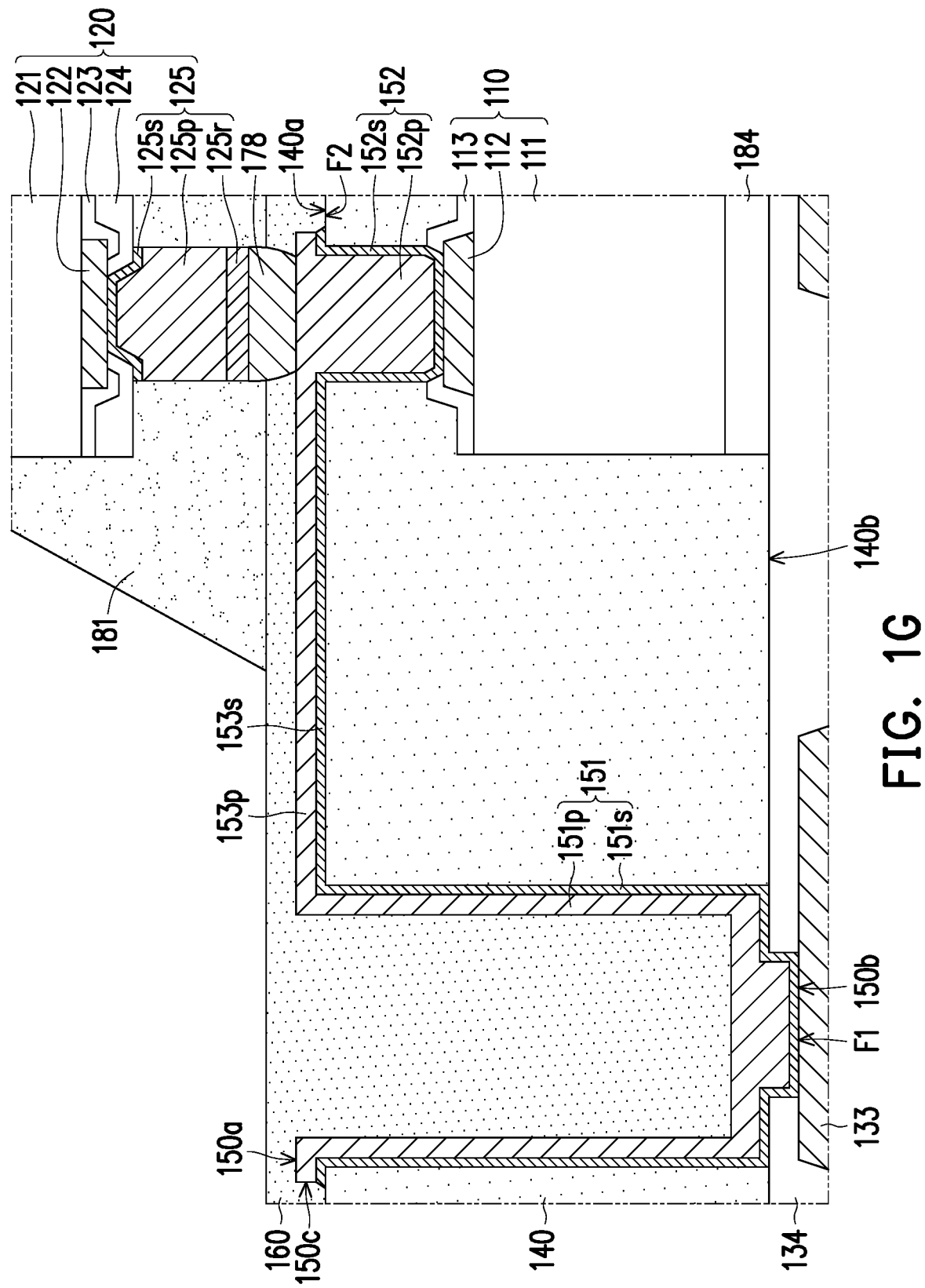
FIG. 1G is a partial cross-sectional view of the package structure according to the first embodiment of the disclosure.

FIG. 1F is a cross-sectional view of the package structure according to the first embodiment of the disclosure. FIG. 1G is a partial cross-sectional view of the package structure according to the first embodiment of the disclosure. FIG. 1G may be an enlarged view corresponding to the area R1 in FIG. 1F. Referring to FIG. 1F and FIG. 1G, after the above steps, the manufacturing process of a package structure 100 of the present embodiment is substantially completed.

The package structure 100 includes the first die 110, the second die 120, the dielectric body 140, the conductive terminal 179 and the first circuit layer 150. The second die 120 is disposed on the first die 110 with the second active surface 120a facing the first active surface 110a. The dielectric body 140 covers the first die 110. The conductive terminal 179 is disposed on the dielectric body 140 and opposite to the second die 120. The first circuit layer 150 includes the first circuit portion 151 and the second circuit portion 152. The first circuit portion 151 penetrates the dielectric body 140. The first die 110 is electrically connected to the conductive terminal 179 through the first circuit portion 151. The second circuit portion 152 is embedded in the dielectric body 140. The second die 120 is electrically connected to the first die 110 through the second circuit portion 152. The first patterned insulating layer 160 covers the first circuit layer 150 and is embedded in the dielectric body 140.

In this embodiment, the first circuit layer 150 may include a conductive top surface 150a, a conductive bottom surface 150b and a conductive lateral surface 150c. The conductive top surface 150a may be a surface of the first circuit layer 150 farthest from the redistribution circuit layer 130. The conductive bottom surface 150b may be a surface of the first circuit layer 150 closest to the redistribution circuit layer 130. The conductive lateral surface 150c may be a surface connected to the conductive top surface 150a and the conductive bottom surface 150b. The first patterned insulating layer 160 may cover a portion of the conductive top surface 150a and a portion of the conductive lateral surface 150c of the first circuit layer 150. In this way, the possibility of peeling of the first circuit layer 150 may be reduced.

In this embodiment, a position of the dielectric bottom surface 140b (which may include a virtual plane extended therefrom) may be between a position of the conductive top surface 150a (which may include a virtual plane extended therefrom) and a position of the conductive bottom surface 150b (which may include a virtual plane extended therefrom), and the position of the dielectric top surface 140a (which may include a virtual plane extended therefrom) may be between the position of the conductive top surface 150a (which may include a virtual plane extended therefrom) and a position of the conductive bottom surface 150b (which may include a virtual plane extended therefrom). In other words, the conductive bottom surface 150b of the first circuit layer 150 and the dielectric bottom surface 140b of the dielectric body 140 (i.e., a surface of the dielectric body 140 closest to the redistribution circuit layer 130) are not coplanar, and the conductive top surface 150a of the first circuit layer 150 and the dielectric top surface 140a of the dielectric body 140 are not coplanar.

In this embodiment, a signal transmission distance between the first die 110 and the second die 120 is substantially the same as a physical distance between the first die 110 and the second die 120. For instance, signals between the first die 110 and the second die 120 may be transmitted through corresponding conductive piece (e.g., the corresponding conductive connecting piece 178 and the corresponding second circuit portion 152), and a distance between the die pad 112 of the first die 110 and the die terminal 125 of the second die 120 is substantially equal to a height or a thickness of said conductive piece (e.g., a height of the corresponding conductive connecting piece 178 and a thickness of the corresponding second circuit portion 152). In this way, the signal transmission quality and efficiency between the first die 110 and the second die 120 may be improved.

In general, in a conductor composed of multiple conductive structures, the signal transmitted along the conductor will have a corresponding reflection signal due to the discontinuity between the multiple conductive structures (e.g., interface or impedance mismatch due to different materials or lattices). This phenomenon may be referred to as return loss. Therefore, compared to signal transmission between the dies with the general redistribution method, the quality and efficiency of the signal transmission between the first die 110 and the second die 120 may be improved by the corresponding conductive connecting piece 178 and the corresponding second circuit portion 152.

In an embodiment, the first die 110 and the second die 120 may be dies, packaged chips, stacked chip packages or application-specific integrated circuits (ASIC) with the same or different functions, but the disclosure is not limited thereto.

In an embodiment, the first die 110 and the second die 120 may be heterogeneous dies. For instance, one of the first die 110 and the second die 120 may be a dynamic random access memory (DRAM) die, a static random access memory (SRAM) die or a high bandwidth memory (HBM) die, and the other one of the first die 110 and the second die 120 may be an application-specific integrated circuit (ASIC) die, an application processor (AP) die, a system on chip (SoC) die or other similar high performance computing (HPC) dies. However, the disclosure is not limited in this regard.

Figure 2:
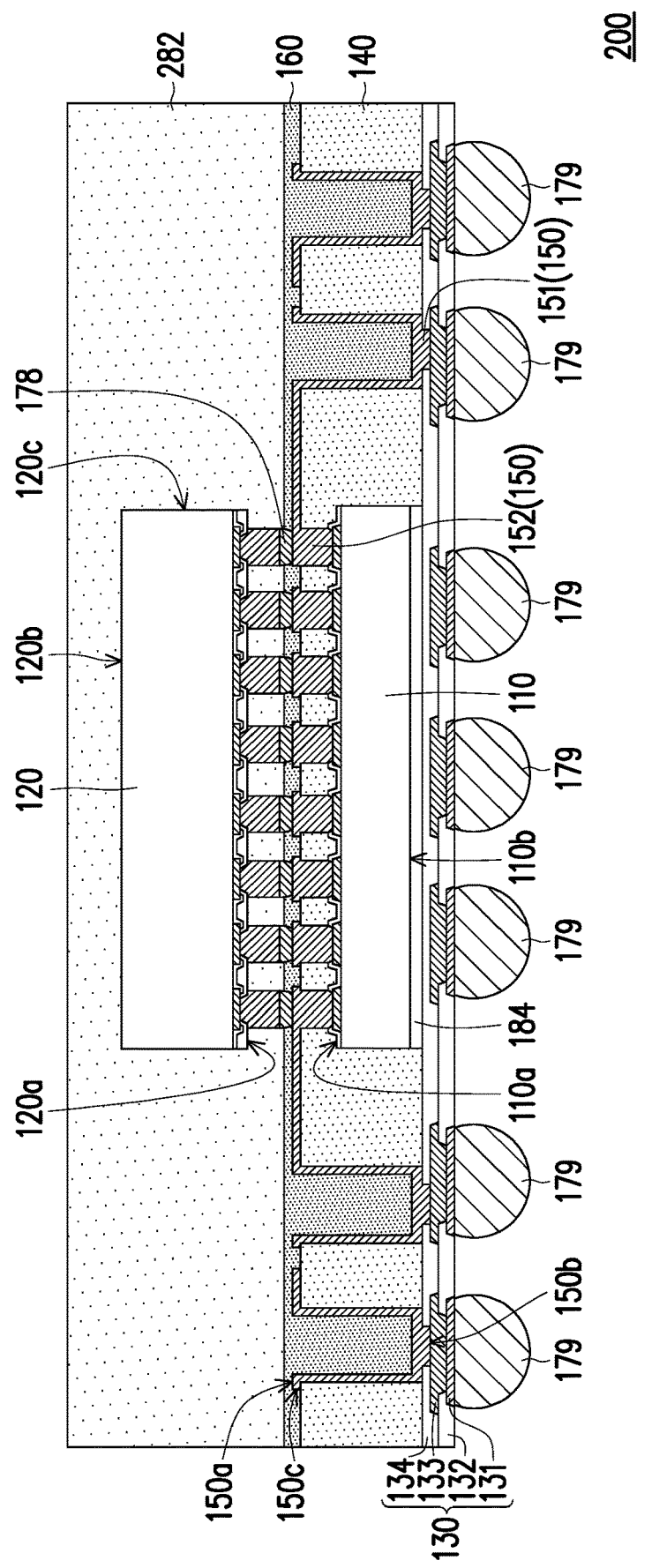
FIG. 2 is a cross-sectional view of a package structure according to the second embodiment of the disclosure.

FIG. 2 is a cross-sectional view of a package structure according to the second embodiment of the disclosure. A package structure 200 of the second embodiment is similar to the package structure 100 of the first embodiment, and includes similar components denoted by the same reference numerals and having similar functions, materials or formation methods (descriptions thereof are omitted).

Referring to FIG. 2, the package structure 200 may include the first die 110, the second die 120, the dielectric body 140, the conductive terminal 179, the first circuit layer 150 and an encapsulant 282. The encapsulant 282 covers the second die 120. For instance, the encapsulant 282 may cover the second lateral surface 120c of the second die 120. In an embodiment, the material of the encapsulant 282 may include epoxy resin or other suitable molding compounds, but the disclosure is not limited thereto. The encapsulant 282 is, for example, formed by a molding process, but the disclosure is not limited thereto.

In this embodiment, the encapsulant 282 may further cover the second back surface 120b of the second die 120, but the disclosure is not limited thereto.

Figure 3:
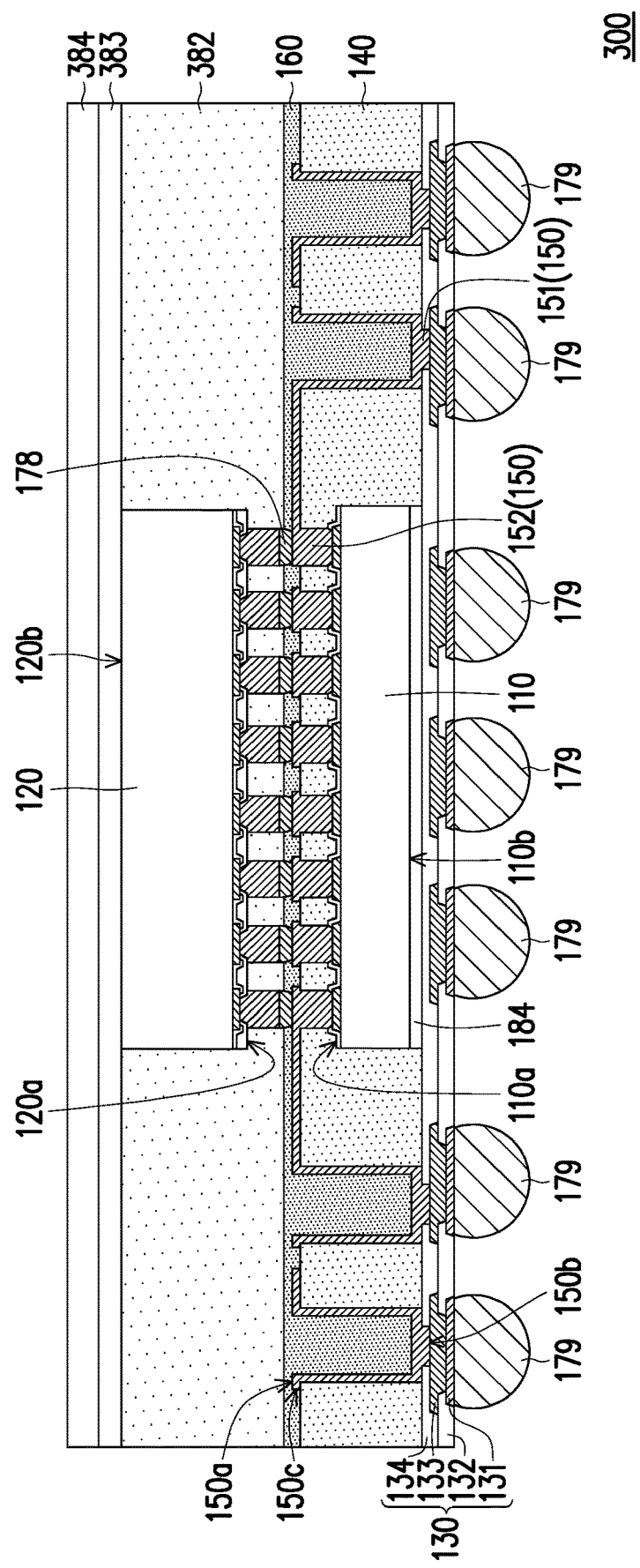
FIG. 3 is a cross-sectional view of a package structure according to the third embodiment of the disclosure.

FIG. 3 is a cross-sectional view of a package structure according to the third embodiment of the disclosure. A package structure 300 of the third embodiment is similar to the package structure 200 of the second embodiment, and includes similar components denoted by the same reference numerals and having similar functions, materials or formation methods (descriptions thereof are omitted).

Referring to FIG. 3, the package structure 300 may include the first die 110, the second die 120, the dielectric body 140, the conductive terminal 179, the first circuit layer 150, an encapsulant 382 and a heat sink 384. The encapsulant 382 may expose the second back surface 120b of the second die 120. The heat sink 384 may be thermally coupled to the second die 120.

In this embodiment, a thermal interface material (TIM) 383 may be disposed between the second back surface 120b of the second die 120 and the heat sink 384, but the disclosure is not limited thereto.

In an embodiment, the second back surface 120b of the second die 120 may directly contact the heat sink 384, but the disclosure is not limited thereto.

In an embodiment, the heat sink 384 may be a heat sink having fins, but the disclosure is not limited thereto.

In summary, the package structure and the manufacturing method of the package structure of the disclosure may provide better signal transmission quality or efficiency.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A package structure, comprising:
a redistribution circuit layer;
a first die, disposed on the redistribution circuit layer and having a first active surface;
a second die, having a second active surface, the second die being disposed on the first die with the second active surface facing the first active surface;
a dielectric body, disposed on the redistribution circuit layer and covering the first die;
a conductive terminal, disposed on the redistribution circuit layer and opposite to the second die;
a first circuit layer, comprising a seed layer and a plating layer disposed on the seed layer, wherein a portion of the seed layer and a portion of the plating layer disposed thereon constitute a first circuit portion and, another portion of the seed layer and another portion of the plating layer disposed thereon constitute a second circuit portion, wherein:
the first circuit portion penetrates the dielectric body, and the first die is electrically connected to the conductive terminal through the first circuit portion and the redistribution circuit layer;
the second circuit portion is embedded in the dielectric body, and the second die is electrically connected to the first die through the second circuit portion; and
a portion of the first circuit portion is embedded in the redistribution circuit layer; and
a first patterned insulating layer, covering the first circuit layer and being embedded in the dielectric body,
wherein the dielectric body has a dielectric bottom surface, the seed layer of the first circuit layer has a conductive bottom surface, the dielectric bottom surface is parallel to the conductive bottom surface, and the dielectric bottom surface and the conductive bottom surface are not coplanar.

2. The package structure of claim 1, wherein the first die comprises a first pad and a first die insulating layer disposed on the first active surface, the first die insulating layer exposes a portion of the first pad, and the seed layer of the second circuit portion directly contacts the first pad.

3. The package structure of claim 1, wherein the second die comprises a second pad, a second die insulating layer and a die terminal disposed on the second active surface, the second die insulating layer exposes a portion of the second pad, the die terminal directly contacts the second pad, and the package structure further comprises:
a conductive connecting piece, disposed between the first die and the second die, the first die being electrically connected to the die terminal through the conductive connecting piece.

4. The package structure of claim 1, wherein the first patterned insulating layer covers a conductive top surface of the plating layer of the first circuit layer, and the first patterned insulating layer covers a conductive lateral surface of the seed layer and the plating layer disposed thereon of the first circuit layer.

5. The package structure of claim 1, wherein the dielectric body contacts the first patterned insulating layer, and an interface is provided between the dielectric body and the first patterned insulating layer, in a direction parallel to the thickness of the package structure, a distance between the interface and the dielectric bottom surface is shorter than a distance between the interface and the conductive bottom surface.

6. The package structure of claim 1, further comprising:
a filling layer, disposed between the second die and the first patterned insulating layer.

7. The package structure of claim 1, further comprising:
an encapsulant, covering the second die.

8. The package structure of claim 7, wherein the encapsulant exposes a portion of the second die.

9. The package structure of claim 1, further comprising:
a heat sink, thermally coupled to the second die.

10. A package structure of claim 1, comprising:
a redistribution circuit layer;
a first die, disposed on the redistribution circuit layer and having a first active surface;
a second die, having a second active surface, the second die being disposed on the first die with the second active surface facing the first active surface;
a dielectric body, disposed on the redistribution circuit layer and covering the first die;
a conductive terminal, disposed on the redistribution circuit layer and opposite to the second die;
a first circuit layer, comprising a seed layer and a plating layer disposed on the seed layer, wherein a portion of the seed layer and a portion of the plating layer disposed thereon constitute a first circuit portion and, another portion of the seed layer and another portion of the plating layer disposed thereon constitute a second circuit portion, wherein:
the first circuit portion penetrates the dielectric body, and the first die is electrically connected to the conductive terminal through the first circuit portion and the redistribution circuit layer;
the second circuit portion is embedded in the dielectric body, and the second die is electrically connected to the first die through the second circuit portion; and
a portion of the first circuit portion is embedded in the redistribution circuit layer; and
a first patterned insulating layer, covering the first circuit layer and being embedded in the dielectric body, wherein the redistribution circuit layer comprising:
a second circuit layer, disposed on a dielectric bottom surface of dielectric body, the conductive terminal being electrically connected to the first circuit portion through the second circuit layer, wherein the seed layer of the first circuit layer directly contact the second circuit layer.

11. The package structure of claim 10, wherein the redistribution circuit layer further comprising:
a second patterned insulating layer, covering the second circuit layer, the second patterned insulating layer having an insulating opening, the seed layer of the first circuit portion being filled into the insulating opening to directly contact the second circuit layer.

12. The package structure of claim 11, wherein an interface is provided between the second circuit layer and the seed layer of the first circuit portion.

13. The package structure of claim 10, wherein the first die comprises a first pad and a first die insulating layer disposed on the first active surface, the first die insulating layer exposes a portion of the first pad, and the seed layer of the second circuit portion directly contacts the first pad.

14. The package structure of claim 10, wherein the second die comprises a second pad, a second die insulating layer and a die terminal disposed on the second active surface, the second die insulating layer exposes a portion of the second pad, the die terminal directly contacts the second pad, and the package structure further comprises:
   a conductive connecting piece, disposed between the first die and the second die, the first die being electrically connected to the die terminal through the conductive connecting piece.

15. The package structure of claim 10, wherein the first patterned insulating layer covers a conductive top surface of the plating layer of the first circuit layer, and the first patterned insulating layer covers a conductive lateral surface of the seed layer and the plating layer disposed thereon of the first circuit layer.

16. The package structure of claim 10, further comprising:
   an encapsulant, covering the second die.

* * * * *